(12) United States Patent
Fuentes (10) Patent No.: US 8,852,383 B2
(45) Date of Patent: *Oct. 7, 2014

(54) WET PROCESSING USING A FLUID MENISCUS APPARATUS

(75) Inventor: Ricardo I. Fuentes, Hopewell Junction, NY (US)

(73) Assignee: Materials and Technologies Corporation, Poughkeepsie, NY (US)

( * ) Notice: Subject to any disclaimer, the term of this patent is extended or adjusted under 35 U.S.C. 154(b) by 855 days.

This patent is subject to a terminal disclaimer.

(21) Appl. No.: 11/582,195

(22) Filed: Oct. 16, 2006

(65) Prior Publication Data

US 2007/0084560 A1      Apr. 19, 2007

Related U.S. Application Data

(63) Continuation-in-part of application No. 09/675,029, filed on Sep. 28, 2000, now Pat. No. 7,122,126.

(60) Provisional application No. 60/156,582, filed on Sep. 29, 1999.

(51) Int. Cl.
*H01L 21/306* (2006.01)
*H01L 21/67* (2006.01)
*C25D 5/02* (2006.01)
*C23C 18/16* (2006.01)

(52) U.S. Cl.
CPC .... *H01L 21/67086* (2013.01); *H01L 21/67057* (2013.01); *H01L 21/6715* (2013.01); *C25D 5/02* (2013.01); *C23C 18/161* (2013.01); *Y10S 134/902* (2013.01)

USPC ............ 156/345.11; 156/345.15; 156/345.23; 118/500; 134/65.2; 134/902

(58) Field of Classification Search
USPC ................ 118/500; 156/345, 345.11, 345.15, 156/345.23; 134/95.2, 902
See application file for complete search history.

(56) References Cited

U.S. PATENT DOCUMENTS 3,953,265 A * 4/1976 Hood ................................ 438/8
4,590,094 A * 5/1986 Ringer, Jr. ...................... 438/780

(Continued)

FOREIGN PATENT DOCUMENTS

EP     1 583 136     10/2005
GB     2 349 742     8/2000

(Continued)

OTHER PUBLICATIONS

Machine Generated English Translation of JP 08-124846 held to Tanaka et al published May 17, 1996.*

(Continued)

*Primary Examiner* — Sylvia R MacArthur
(74) *Attorney, Agent, or Firm* — Kenyon & Kenyon LLP (57) ABSTRACT

A wet processing apparatus and method that takes advantage of a fluid meniscus to process at least a portion of a surface of an object. After one surface of the object has been processed another side or surface of the object can be similarly processed. This processing can be coating, etching, plating, to name a few. An application of the apparatus and method is in the semiconductor processing industry, especially, the processing of wafers and substrates. The method and apparatus also allows the processing of multiple surfaces of an electronic component.

27 Claims, 4 Drawing Sheets

(56) References Cited

U.S. PATENT DOCUMENTS

| | | | |
|---|---|---|---|
| 5,270,079 A * | 12/1993 | Bok | 427/429 |
| 5,339,842 A * | 8/1994 | Bok | 134/1 |
| 5,660,642 A * | 8/1997 | Britten | 134/30 |
| 5,689,749 A | 11/1997 | Tanaka et al. | |
| 5,826,130 A * | 10/1998 | Tanaka et al. | 396/611 |
| 6,555,017 B1 * | 4/2003 | Rushford et al. | 216/84 |
| 6,766,817 B2 | 7/2004 | Da Silva | |
| 6,918,404 B2 | 7/2005 | Da Silva | |
| 7,066,586 B2 | 6/2006 | Da Silva | |
| 7,244,398 B2 | 7/2007 | Kotary et al. | |
| 7,285,255 B2 | 10/2007 | Kadlec et al. | |
| 8,206,548 B2 * | 6/2012 | Kajino et al. | 156/345.18 |
| 2004/0050405 A1 | 3/2004 | Christenson et al. | |
| 2005/0221621 A1 * | 10/2005 | Mikhaylichenko et al. | 438/745 |
| 2005/0268847 A1 * | 12/2005 | Farnworth | 118/663 |
| 2005/0284369 A1 * | 12/2005 | Miya et al. | 118/500 |
| 2007/0084560 A1 * | 4/2007 | Fuentes | 156/345.11 |
| 2007/0116551 A1 * | 5/2007 | Fuentes | 414/805 |
| 2008/0015531 A1 | 1/2008 | Hird | |
| 2009/0212019 A1 * | 8/2009 | Fuentes | 216/92 |

FOREIGN PATENT DOCUMENTS

| | | |
|---|---|---|
| JP | S62-188322 | 8/1987 |
| JP | H03-272140 | 12/1991 |
| JP | H08-124846 | 5/1996 |
| JP | H10-074-724 | 3/1998 |
| JP | 2000-294527 | 10/2000 |
| JP | 2004-006518 | 1/2004 |
| JP | 2005-311354 | 11/2005 |
| JP | 2005-328038 | 11/2005 |
| WO | WO 02/32825 | 4/2002 |

OTHER PUBLICATIONS

PCT International Search Report and Written Opinion from PCT/US06/40732, mailed on Jun. 4, 2008.

Supplementary European Search Report from European Patent Application No. 06 82 6197 mailed on Jun. 15, 2011.

* cited by examiner

WET PROCESSING USING A FLUID MENISCUS APPARATUS

RELATED APPLICATIONS

This application is a continuation-in-part application, and claims the benefit of priority, of U.S. patent application Ser. No. 09/675,029, filed on Sep. 28, 2000 now U.S. Pat. No. 7,122,126, which itself is based upon and claims the benefit of priority of U.S. Provisional Patent Application No. 60/156,582, filed Sep. 29, 1999, the disclosure of each of these applications hereby being fully incorporated by reference.

FIELD OF THE INVENTION

This invention relates to an improved method and apparatus to expose surfaces to a liquid, using at least one fluid meniscus. Such system is applicable to "wet processing" single sides of substrates, without disturbing the "backside," while in some embodiments assisting confinement of the fluid to the frontside by means of, e.g., a gas flow, such as it is necessary, or would be desirable, in a variety of semiconductor and other micro-fabrication technologies. This invention is not limited to a specific area of technology or set of applications, but it is applicable to situations where exposure of surfaces to fluids is required. Examples of such are: etching, substrate thinning, electroplating, micro-structure release, device or substrate cleaning, MEMS (Micro-Electro-Mechanical Systems), optoelectronic, photovoltaic and electronic device fabrication; to name a few.

BACKGROUND INFORMATION

Wet processing (i.e. the exposure of a surface or surfaces to a fluid or fluids) is an essential part of many technologies. In particular, semiconductor, micro-electro-mechanical systems (MEMS, also known as micro systems, among other names), photovoltaic technologies rely heavily on wet processes for the manufacturing of devices. Processes such as etching, resist developing, patterning, stripping, release, electroplating, and thinning are all usually performed by the exposure of surfaces to liquids; i.e. wet processing.

One of the main drawbacks of all prior art is the reliance of wet processes on immersion of the parts in a liquid, on some form of spraying, or in a combination of liquid delivery and substrate spinning, to accomplish the exposure of the surface to the liquid. These methods, and their many variants, usually expose, at least to a relevant extent, other surfaces that would be desirable to protect from the fluid. To prevent unwanted exposure of surfaces. The prior art has usually relied on the application of protective layers, or resists.

As fabrication technologies advance and higher functionality and feature densities are a major driver of systems performance and lower prices; a true single sided wet process would provide additional process flexibility and allow a higher level of integration. In particular, features or devices could be in a finished state on one side while wet processing could continue on the other side without jeopardizing its integrity by wetting it or otherwise exposing it to the fluid or its vapors, using resists, masks or other forms of protection.

There are wet processing systems that attempt to perform single sided wet processing, that is, even though the exposure takes place primarily on one side, it usually exposes the other side to relevant levels of mist or vapor. Such exposure is sufficient to either disqualify such systems for single sided processing, or merit the use of resists or other forms of protection to prevent damage to the side not being processed.

However, the present invention is capable of single-sided processing without exposing the backside of the surface in process, thus enabling a great variety of novel processes and new levels of device integration, among other things. It is clear that all applications and implications of the present invention are not all listed here, but, nevertheless, are also a part of this invention.

Furthermore, due to the present invention's intrinsic virtual decoupling of transport phenomena from the action of the fluid, the present invention improves upon attainable uniformity as compared to conventional arrangements. This may be of particular importance in processes that remove material off of the substrate's surface by the action or contact with the fluid. Such applications include, e.g., etching, thinning, developing, among others. This uniformity improvement can be up to ten times better than that which can be attained with conventional arrangements, e.g., spin, spray or immersion etching, etc., depending on the particulars of the process.

SUMMARY OF THE INVENTION

The invention is a novel method and an apparatus for processing a single side of an object using a fluid meniscus.

Therefore, one aspect of this invention is to provide an apparatus and a method that will allow the processing of a single side of an object using at least one fluid meniscus.

Another aspect of this invention is to provide an apparatus and method to wet process a single side of an object with improved uniformity.

Another aspect of this invention is to utilize at least one fluid meniscus to carry out processing of objects, especially objects that are used in the electronics industry.

Another aspect of this invention is to provide an apparatus and method to wet process a substrate while protecting its backside by using a dynamic fluid, e.g., gas, confinement method to prevent liquids, gases or vapors from coming in contact with the back side.

Therefore, in one aspect this invention comprises a fluid meniscus process, comprising the steps of:

(a) holding at least a portion of a first surface of an object with a holding fixture, such that at least a portion of a second surface of the object is exposed;

(b) injecting at least one liquid in a holding tank such that a fluid meniscus is formed;

(c) contacting at least a portion of the second surface of the object with at least a portion of the fluid meniscus; and (d) removing the object after at least one contact with the fluid meniscus.

In another aspect this invention comprises an object having a first surface and a second surface, wherein the first surface has at least one first feature, and wherein the second surface has at least one second feature, and wherein the first feature is on the back side of the second feature, wherein the first feature is selected from a group consisting of grating, patterned features, metallic features, non-metallic features, channel, mirror, filter, through-hole, blind hole, membrane, beam, mechanical device, optical device, optoelectronic device, photovoltaic device, CMOS, MEMS, SOI and CCD, and wherein the second feature is selected from a group consisting of grating, patterned features, metallic features, non-metallic features, channel, mirror, filter, through-hole, blind hole, membrane, beam, mechanical device, optical device, optoelectronic device, photovoltaic device, CMOS, MEMS, SOI and CCD.

In yet another aspect this invention comprises an apparatus for transferring a portion of a fluid meniscus layer on an object, comprising:

(a) an object having a first surface and a second surface;

(b) a holding fixture to hold a portion of the first surface of the object, such that at least a portion of a second surface of the object is exposed;

(c) at least one holding tank containing at least one fluid with a fluid meniscus;

(d) means for transferring at least a portion of the fluid meniscus onto at least a portion of the second surface of the object; and (e) means for removing the object after at least one contact with the fluid meniscus.

In yet another aspect this invention comprises an apparatus for transferring a portion of a fluid meniscus layer on an object, comprising:

(a) an object having a first surface and a second surface;

(b) a holding fixture to hold a portion of the first surface of the object, such that at least a portion of a second surface of the object is exposed;

(c) at least one holding tank containing at least one fluid with a fluid meniscus of an arbitrary shape and size such as to interact with the object's surface by wetting an area of said arbitrary shape while either staying over said meniscus or being moved in an arbitrary fashion, including translation, rotation, oscillation, or portions, or combinations, or superpositions of said motions.

(d) means for transferring at least a portion of the fluid meniscus onto at least a portion of the second surface of the object; and (e) means for removing the object after at least one contact with the fluid meniscus.

In still another aspect this invention comprises an apparatus for transferring a portion of a fluid meniscus layer on an object, comprising:

(a) an object having a first surface and a second surface;

(b) a holding fixture to hold a portion of the first surface of the object, such that at least a portion of a second surface of the object is exposed;

(c) at least one holding tank containing at least one fluid with a fluid meniscus;

(d) means for transferring at least a portion of the fluid meniscus onto at least a portion of the second surface of the object;

e) means of removing, totally or partially, the liquid of the second surface after said second surface has just made contact with said fluid meniscus (f) means for removing the object after at least one contact with the fluid meniscus.

In another aspect this invention comprises an apparatus for transferring a portion of a fluid meniscus layer on an object, comprising:

(a) an object having a first surface and a second surface;

(b) a holding fixture to hold a portion of the first surface of the object, such that at least a portion of a second surface of the object is exposed, while a fluid, e.g., a gas, flows onto the whole or a portion of the first surface via a suitable device or apparatus, such as shaping or other fluid dynamic devices or apparatus;

(c) at least one holding tank containing at least one fluid with a fluid meniscus;

(d) means for transferring at least a portion of the fluid meniscus onto at least a portion of the second surface of the object;

e) means of removing, totally or partially, the liquid of the second surface after said second surface has just made contact with said fluid meniscus (f) means for removing the object after at least one contact with the fluid meniscus.

In another aspect this invention comprises an apparatus for transferring a portion of a fluid meniscus layer on an object, comprising:

(a) an object having a first surface and a second surface;

(b) a holding fixture to hold a portion of the first surface of the object, such that at least a portion of a second surface of the object is exposed, while gas flows onto the whole or a portion of the first surface;

(c) at least one holding tank containing at least one fluid with a fluid meniscus of an arbitrary shape and size such as to interact with the object's surface by wetting an area of said arbitrary shape wile either staying over said meniscus or being moved in an arbitrary fashion, including translation, rotation, oscillation, or portions, or combinations, or superpositions of said motions.

(d) means for transferring at least a portion of the fluid meniscus onto at least a portion of the second surface of the object;

e) means of removing, totally or partially, the liquid of the second surface after said second surface has just made contact with said fluid meniscus (f) means for removing the object after at least one contact with the fluid meniscus.

In another embodiment, the present invention relates to an apparatus for performing a fluid meniscus process on an object, the object having a first surface and a second surface, that includes (a) at least one holding tank containing a fluid forming a fluid meniscus; (b) a holding fixture for holding the object such that at least a portion of the fluid meniscus contacts and is transferred to at least a portion of the second surface of the object; and (c) a fluid interaction element configured to interact with the at least a portion of the fluid that was transferred to the second surface.

The fluid interaction element may be configured to at least one of move, displace, remove, spread and dry the at least a portion of the fluid that was transferred to the second surface. The fluid interaction element may be an air device that is configured to blow air towards the at least a portion of the fluid that was transferred to the second surface. Alternatively or additionally, the fluid interaction element may be a vacuum device that is configured to provide a vacuum to the at least a portion of the fluid that was transferred to the second surface. Alternatively or additionally, the fluid interaction element may be a blade that is configured to interact with and/or move the at least a portion of the fluid meniscus that was transferred to the second surface. Alternatively or additionally, the fluid interaction element may be a capillary material that is configured to interact with and/or move the at least a portion of the fluid that was transferred to the second surface.

In various embodiments of the present invention, the fluid interaction element may be moveable relative to the object. Also, the fluid interaction element may be configured to move into and/or out of, or relative to, a path defined by the movement of the object. A movement of the fluid interaction element may correspond to a motion of the object, e.g., to at least one of a speed and a direction of motion of the object. The movement of the fluid interaction element may be actuated by an actuator, the actuator being at least one of pneumatic and electromagnetic, among other types. At least one of the fluid interaction element and the object may be configured to move relative to each other, the relative motion including at least one of translation, rotation, oscillation, and/or portions, combinations, or superpositions of said motions. In addition, the fluid interaction element may be configured to provide a gas on at least a portion of the first surface of the object so as to prevent the at least a portion of the fluid meniscus that was transferred to the second surface from moving to the first surface. The gas may be provided so as to prevent liquid, vapor and/or gas generated by the at least a portion of the fluid meniscus that was transferred to the second surface from moving to the first surface. The holding fixture may function in combination with the fluid interaction element so as to prevent the at least a portion of the fluid meniscus that was transferred to the second surface from moving to the first surface.

The holding tank may have a shape, and may impart a corresponding shape to the fluid meniscus, that includes one of a long rectangle, a "pie" shape, a "D" shape, a round shape, and combinations, superpositions or distortions of said shapes. In an embodiment, the shape and dimensions of the holding tank may be changed dynamically during the process or between processes to accommodate substrates of different sizes, shapes, or to impart certain properties to the fluid pool. The apparatus may be configured to remove the at least a portion of the fluid meniscus from contact with the second surface of the object after at least one such contact. The object may be selected from a group consisting of semiconductor wafer, substrate, metal and non-metal composites, metal and non-metallic material, silicon, indium phosphide, ceramic, glass, group IV element, group III-V compound, group II-VI compound, and binaries and ternaries thereof. The object may be held by the holding fixture using at least one of mechanical, vacuum, electrostatic, fluidic, Bernoulli, magnetic and electromagnetic operation. The fluid may be selected from a group consisting of an etching fluid, a plating fluid, a solvent, a wetting fluid, a cleaning fluid, a photo resist, a developer and a stripper. The fluid in the holding tank may be at least one of re-circulated, agitated, heated and replenished. The object may have at least one coating of at least one material, and wherein the coating is selected from a group consisting of metal, organic material, inorganic material, insulator and resist. The holding tank may have at least one channel to hold the fluid, and may have at least one overflow channel, while the fluid may be injected onto the holding tank using at least one pump or other suitable device. Different devices or methods of feeding, moving, delivering, overflowing, shaping, draining, recirculating, etc., are conceivable and are also objects of the invention. The fluid may etch the at least a portion of the second surface of the object, and wherein the object is selected from a group consisting of semiconductor wafer, substrate, metal and non-metal composites, metal and non-metallic material, silicon, indium phosphide, ceramic, glass, group IV element, group III-V compound, group II-VI compound, and binaries and ternaries thereof. Also, the fluid meniscus may be used to perform a function selected from a group consisting of etching, thinning, electroplating, microstructure release, cleaning, electronic device fabrication, electrochemical processing, photochemical processing, photo-electro plating, optoelectronic processing, patterning, resist application, developing, plating, coating and stripping.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Even though a large number of possible applications are conceivable, in its preferred embodiment the current invention provides a substantial improvement over prior art in providing for wet processing of a single side of a substrate without adversely disturbing its backside. It is envisioned that true single sided wet processing, such as provided by the subject of this invention, enables further and faster increase of functionality and feature-or device-density per die, by easing the restrictions on using both sides of the substrate. Further, it may afford the capability to etch or thin substrates in a more environmentally safe, faster, uniform and economic manner.

An example of one such application using this invention would be the integration of CMOS and MEMS devices, each type on its own side of a substrate and being run through its own processing line. This is of particular significance since this example illustrates two types of devices that would benefit from integration but which processes are mutually incompatible, therefore making their integration into the same "chip" difficult. Similar situations may apply to a variety of processes, devices, features, types or levels of integration. It is conceivable that by using a sequence of said processes a tri-dimensional device or hybrid can therefore be fabricated. Further, cost and density of "stacked" devices may also be possible by the use of the present invention.

Another example of the advantages of true single sided wet processing is the thinning of substrates. These can be those of devices after or during processing, such as CCD, MEMS, or other optoelectronic, photovoltaic, or imaging devices; as well as blank substrates.

Still another advantage of this invention is the possible reduction of the cost of thin, silicon-on-insulator (SOI), photovoltaic, and MEMS substrates or devices, among others.

The high etch rates and uniformity of which the subject of this invention is capable makes it an attractive choice for the fabrication of thin substrates. A large variety of technologically relevant materials can be processed, such as, metal and non-metal composites, metal and non-metallic materials, silicon, germanium, InP (indium phosphide), ceramic and glass, among others.

The subject of this invention may also be used to clean the exposed surface via chemical agents that are delivered to it either separately, premixed, or mixed in-situ, such to accomplish the desired cleaning action. Chemicals can be made to react at, near, or en-route to the substrate to achieve the desired reaction and effect.

The present invention may also be used advantageously to electroplate materials onto substrates while simultaneously taking advantage of all beneficial features described in this specification. There are no intrinsic limits imposed by the subject of this invention as to the type of material to be electroplated; nor there are limitations as to other aspects of the application of the subject of this invention to electroplating. Similarly, the subject of this invention can be advantageously used to perform other electrochemical processes involving fluids and surfaces. All such uses and applications are also subjects of this invention.

The invention can also be used advantageously to perform photochemical processes which involve fluids and surfaces. A beam or beams 41 of virtually any shape and in multiple locations can be shined from underneath the fluid channel 22 or liquid module 10, as more clearly seen in FIG. 4, to effect the reaction and carry the process. Processes such as photo-electro-plating, selective plating, selective etching, among others, can be accomplished by the appropriate implementation of the subject of this invention. Is it conceivable that many other embodiments, variations and modifications are possible and are also subjects of this invention. Furthermore, in place of photon beams, electrodes or electrode arrays can be placed in proximity of the process surface so as to interact with it and/or the fluid.

The present invention can also be used advantageously to single-side etch patterned surfaces on a variety of materials, with or without resists. Such patterns include but are not limited to those of electronic devices, photo-electronic devices, gratings, MEMS, and other active and/or passive devices or elements, to name a few.

Furthermore, this invention allows for the reduced and more efficient use of chemicals used for common processes, such as etching, thinning, cleaning, developing, electroplating, among others. This is accomplished via many possible implementations of the system of this invention. One feature is its reduced use of chemicals as compared to typical immersion techniques. Another relevant implementation would be the recirculating aspect of the chemical delivery and handling. These features of the current invention, may make it an attractive alternative to current state of the art on the basis of economic and environmental advantages.

FIGS. 1A, 1B, 1C and 1D, illustrate an embodiment of this invention where a holding tank or a liquid module 10, has at least one fluid channel 22, and at least one fluid overflow channel 24. The fluid channel 22, contains at least one liquid 23, having at least one fluid meniscus 16. A holding fixture or a substrate module 12, securely holds at least one object 14, such as, a wafer 14, substrate 14, to name a few. The overflow channel 24, should be such that any fluid 23, that overflows as fluid 17, can be further processed, as discussed elsewhere. For the ease of understanding related motor, sensing, control subsystems; to the extent the later are required by a particular implementation, are not shown in the figures. It is evident that other combinations or modifications are possible, and are also subjects of this invention.

Figure 1A:
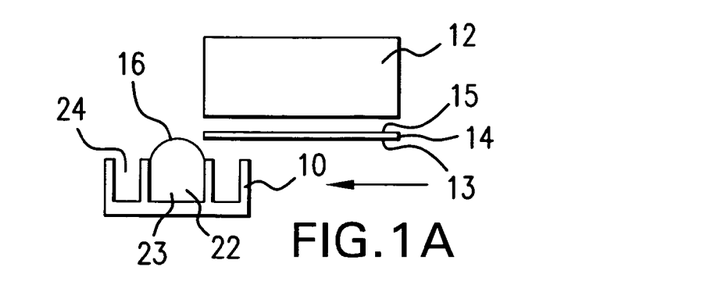
FIG. 1A illustrates a preferred process and apparatus of this invention.
Figure 1B:
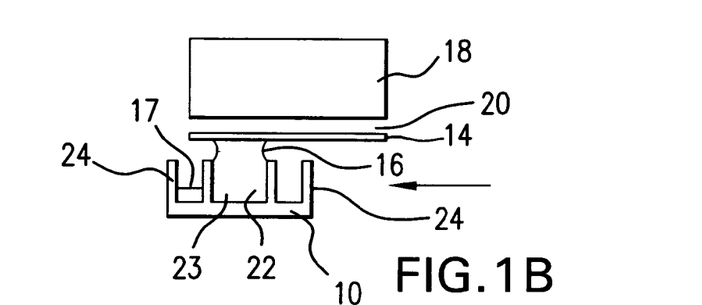
FIG. 1B illustrates the object in contact with a fluid meniscus.
Figure 1C:
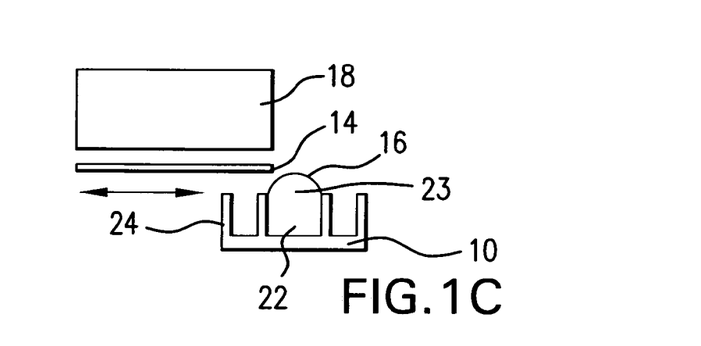
FIG. 1C illustrates the object after making at least one contact with the fluid meniscus.
Figure 1D:
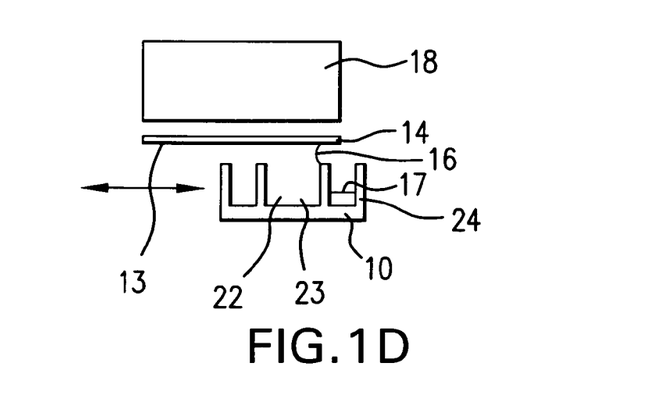
FIG. 1D illustrates the object making another contact with the fluid meniscus.

The substrate 14, has a first or lower surface 13, and a second or upper surface 15. The substrate 14 could be held by the substrate module 12, using a suitable vacuum, mechanical, fluidic, Bernoulli, or electrostatic chuck or by other appropriate means; and scanned over the fluid meniscus 16, as many times as necessary to achieve the desired results. The speed of the scan is determined by the process requirements and results desired, and can vary from zero (i.e. substrate 14, that is exposed to the fluid 23, is at a single place and is not moving), to moving at many feet per second. FIG. 1A-1D, illustrate schematically such motion as it progresses from right (FIG. 1A) to left (FIG. 1B, 1C), and back to the right (FIG. 1D).

Similarly, the substrate 14, can be rotated at various speeds during, after, prior, in between scanning motions, or at any time as deemed necessary; depending on the process requirements and results desired. Rotational speeds can typically vary from zero (i.e. no rotation) to many thousand revolutions per second. In a preferred embodiment, the substrate module 12, may include or contain a "substrate head" 18, which contains the motors, chucks, and feedthroughs necessary to achieve the previously described motions and combinations thereof, which for the ease of understanding have not been shown here.

Also, in a preferred embodiment a gas current is employed through the gap 20, between the substrate 14, and the substrate module 12, to help prevent fluid 23, creeping or moving up onto the top surface 15. This gas current also helps minimize vapor transport onto the top surface 15, of the substrate 14. The gas used is selected to be compatible with the process and can be any gas or fluid that accomplishes such purpose. In a preferred embodiment, nitrogen or dry compressed air are used. Also, in a preferred embodiment, the gap 20, between the substrate head 12, and the substrate 14, is set such as to produce such isolation, or other desired, effects.

In a preferred embodiment, the substrate 14, moves over the meniscus 16, in such a manner as to expose successive substrate area elements, or stripes, to the liquid 23. If the operation carried out involves the chemical removal of substrate material (i.e. etching), such as during a thinning operation, the geometry of the operation is analogous to that of the mechanical removal of material by a rotating planer or other similar tools. By effecting the processing in such narrow stripes, most if not all asymmetries related to mass and thermal transport to the edges are virtually eliminated.

In a preferred embodiment, the fluid 23, used for processing is being continuously replenished into the fluid channel 22. This can be done either open or closed loop (i.e. the fluid 23, used discarded after one pass, or recycled, with or without any form of treatment, to go back into the fluid channel). The chemistry of the fluid 23, can be adjusted during such passes or not. Similarly, the temperature, or other properties, of the fluid 23, can be adjusted during such passes or not. Such choice is dependent on a variety of aspects, such as environmental, economical, process issues, throughput, and uniformity, among others. The characteristics of the fluid can be assessed by essay, colorimetric, spectroscopic of other suitable means, and this information can be fed back into the process to, in turn, adjust any or all of such characteristics. During normal operation as part of the re-circulation process or as overflow during the passage of the substrate 14, over it, the fluid 23, in the fluid channel 22, may overflow into the overflow channels 24, so that the overflowed fluid 17, can be further processed, such as, discarded, recycled, replenished by combining with a fresh batch of fluid 23, and injected back into the fluid channel 22. The fluid 23, collected herein is either accumulated, disposed off, or re-circulated, as detailed above. In a preferred embodiment vacuum or gravity acts upon the overflow channels 24, to assist in the transport of liquid 23, along its intended path; but any other arrangements, including overflow aided just by the force of gravity, vacuum-gravity combinations, chemical reaction, or electrostatic forces, or combinations thereof, are also subjects of this invention. It is also obvious that several configurations are conceivable regarding the liquid handling aspects of the system, such as different liquid removal, accumulation, pumping, confinement, and management implementations; among others. These, and all other possible, configurations and implementations are also subjects of this invention. Similarly, other geometries, arrangements, or embodiments regarding the configuration, size, shape or other characteristics of the liquid or overflow channels; including the absence, partial or total of either one of them, are also subjects of this invention. Similarly, any configuration involving a multiplicity, or any number, of the same channels or modules is also a subject of this invention.

Figures 2, 3:
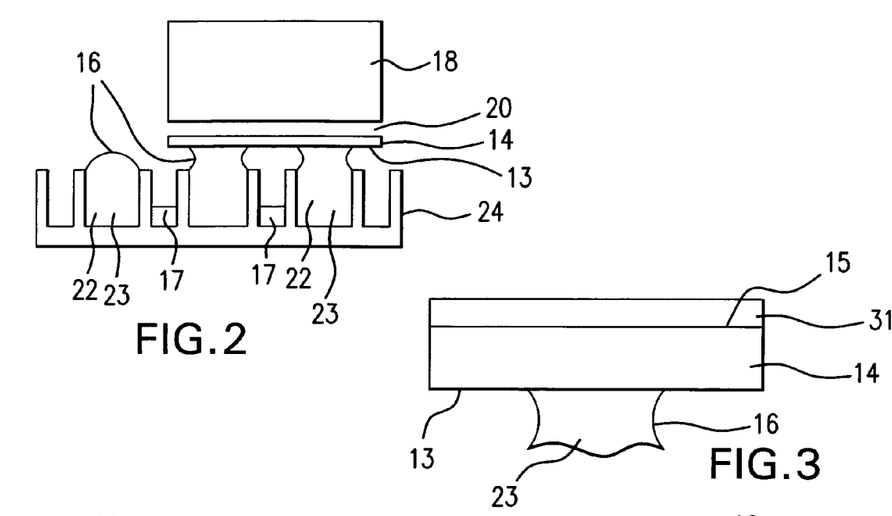
FIG. 2 illustrates another embodiment of this invention.
FIG. 3 illustrates yet another embodiment of this invention.

This invention could employ more that one liquid module 10, positioned side to side 26, as illustrated in FIG. 2, in a manner that the substrate 14, is exposed to more than one liquid meniscus 16, per pass. The number of liquid modules 10, used would depend on a variety of factors, such as desired process rates, throughput, substrate geometries, among others. Many variants and combinations are conceivable and are also subjects of this invention. Such mulitiplicity of liquid modules can also be arranged in a "carousel" of "ferris wheel"-type arrangement.

Alternative embodiments of the current invention can perform a sequence of steps aimed to further and complement each other. Such furthering or enhancement of the functions of the subject of this invention, achieved either by the combination of components of this same invention, or by the addition of other mechanisms, apparatuses, devices or equipment, and the apparatuses resulting from such implementations are contemplated herein and also the subject of this invention. One such sequence may clean, etch, thin, clean, scrub, clean and rinse a substrate using the same principles described herein and are also subject of this invention. Such implementations may include, but are not limited to, sonic, ultrasonic or megasonic forms of energy, mechanical scrubbing, or electromagnetic radiation as the source of the additional function.

It is also a subject of this invention where any embodiment of the above which has other forms of energy or matter attached or discharging into or around the components of the subject of this invention. Such forms may include, but are not limited to, any form of electromagnetic radiation, electromagnetic field, light, any form of acoustical energy, any form of mechanical energy, and any form of thermal energy, 41, to name a few.

FIG. 3, illustrates yet another embodiment of this invention, where the object 14, has at least one protective coating 31, on its upper or second surface 15, and where the lower or the first surface 13, is in direct contact with the fluid 23, and the fluid meniscus 16. Such protective coating 31 may consist of, for example, one or more of tape, resists, among others.

Figure 4:
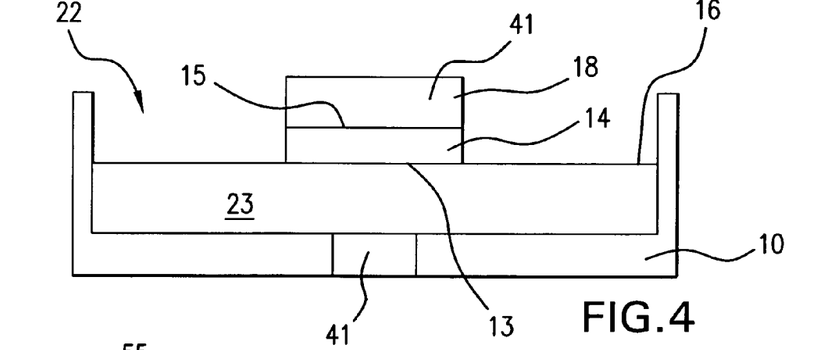
FIG. 4 illustrates still another embodiment of this invention.

FIG. 4, illustrates still another embodiment of this invention, where the lower or the first surface 13, of the object 14, is in direct contact with the fluid 23, and the fluid meniscus 16, within the holding tank 10, and wherein the holding fixture or substrate head 18, and/or the holding tank 10, has at least one energy source 41. The energy source 41, could be selected from a group comprising electromagnetic radiation, light, acoustical energy, mechanical energy, thermal energy, to name a few. For example, the energy source 41, could be a beam of light 41, that is shined through the fluid 23, towards the fluid meniscus 16, and the first or lower surface 13, of the object 14, to perform, for example, a photo lithographic operation, a photochemical operation, a photo-electro-plating operation, selective plating, selective etching, to name a few.

Figure 5:
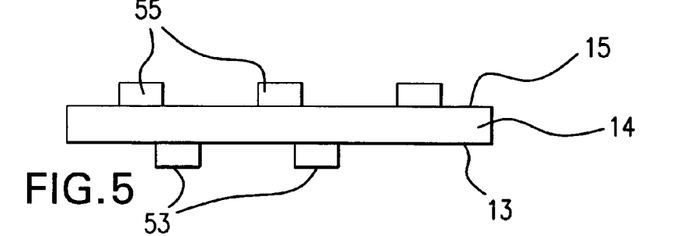
FIG. 5 illustrates yet another embodiment of this invention.

FIG. 5, illustrates yet another embodiment of this invention, where the object 14, has a first surface 13, 15, and a second surface 13, 15, wherein the first surface 13, 15, has at least one first feature 53, 55, of a first type 53, 55, and wherein the second surface 13, 15, has at least one second feature 53, 55, of a second type 53, 55, and wherein the first feature 53, 55, of the first type 53, 55, is different than the second feature 53, 55, of the second type 53, 55. For example, the first feature 53, 55, could be selected from a group of active features comprising CMOS, MEMS, SOI or CCD (couple charged device), photovoltaic to name a few, or passive features, for example, grating, metal or non-metal lines and/or vias. Similarly, the second feature 53, 55, could be selected from a group of active features comprising CMOS, MEMS, CCD, photovoltaic or SOI, to name a few, or passive features, for example, grating.

Figure 6:
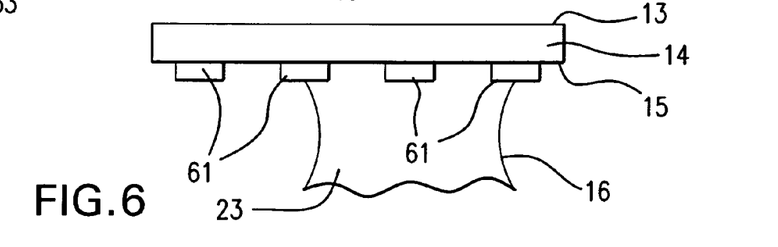
FIG. 6 illustrates still another embodiment of this invention.

FIG. 6, illustrates still another embodiment of this invention, where the object 14, has a portion of the first surface 13, covered with at least one protective layer 61, while leaving a portion of the first surface 13, exposed for processing, such as, to allow the exposed surface 13, to make direct contact with the fluid meniscus 16, of the fluid 23. The area under the protective layer 61, could be a virgin surface area 13, or a previously processed area 13, or an area 13, having one or more features 53, 55, that are being protected by the layer 61. Such a protective layer 61, could be used in an electronic process, such as, using a resist layer 61, to protect a portion of the surface 13, of a wafer 14. The protective layer 61, could be an organic layer 61, or an inorganic layer 61.

It should be understood that there are a number of ways to hold the object 14, for example, the object 14, could be held to the holding fixture 12, by a method selected from a group comprising mechanical means, electrostatic means, fluidic means, using for example, Bernoulli's principles, magnetic means, electromagnetic means, or other non-contact methods, to name a few.

The applicant has used the term "single-sided" or "single-sided processing" to clarify that while one surface is being processed or is in contact with the fluid meniscus 16, of the fluid 23, the other side or the second surface or the backside of the object 14, is not significantly or substantially disturbed during the processing the first side.

This invention allows that a structure or device can be built on both sides of the object, such as, a wafer or substrate, which could not be built otherwise by conventional means. For example, one could use this invention to build at least one CMOS device on one side and another different device on the same side, or another CMOS or another different device on the other or backside. The use of the "real estate" on both sides is made possible by the use of the invention's "true single sided" processing capability. Similarly, thinner or denser "packages" of devices can be made by the use of this invention, potentially at a lower cost and/or with lesser environmental impact as compared with conventional means.

It should be understood that the device(s) on either side of the wafer or the object do not have to be different. One could have CMOS on one side and CMOS on the other, or one could have any combination of active and/or passive devices, such as, CMOS and MEMS, gratings and MEMS, gratings and optics, photo-electronic and gratings, to name a few, on each side respectively. One can also see that this invention enables the use of both sides of an object, such as, a wafer, in a simple, efficient and cost effective manner. However, one could also use this invention to make other features/structures, such as, for example, channel, mirror, filter, hole, membrane, beam, optoelectronic and mechanical devices, or other similar features/structures.

Furthermore, the object could be made of a variety of materials, such as, for example, a group IV element (e.g. Ge, Si), group III and V compounds (e.g. InP), group II and VI compounds (e.g. CdSe, HgTe), or other binaries (e.g. SiN) and ternaries between these systems (e.g. AlGaAs).

For most applications the holding fixture 12, 18, would move the object 14, into contact with the fluid meniscus 16. However, in some cases the holding tank 10, containing the fluid 23, may be made to move so that the fluid meniscus 16, comes into contact with the surface of the object 14. For some applications one could move the holding fixture 12, 18, and also the holding tank 10, at the same time, and at the same or different speeds.

Although many embodiments, variations and combinations are conceivable, and also subjects of this invention; some such relevant embodiments and variations are listed below:

This invention, its variants, and its alternative embodiments, independently of its applications or processes it may be applied to any similar apparatus and/or process.

This invention could utilize any fluid 23, as long as the fluid 23, forms at least one fluid meniscus 16.

This invention can be used with any geometry of surface, surfaces, or substrates 14. This invention can be used with any topography of surface, surfaces, or substrates 14. Similarly, this invention can be used with any substrate material or substance.

This invention as discussed elsewhere can be used to perform any other processes, in addition to those mentioned in this specification.

This invention allows it to be used in any other configurations, in addition to those being mentioned in this specification.

This invention can be implemented along with any other form of energy source, in addition to those being mentioned in this specification.

This invention can be used inverted, rotated or mirrored about any of its axis.

This invention can be used with a different number of liquid modules 10, other than the ones described in the specification.

This invention can be used with a different number of fluids 23, or overflow channels 24, than the ones described in this specification.

This invention can be modified to embody different arrangements, variations, or geometries of its fluids 23, and the overflow channels 24, in addition to described in the specification.

This invention also allows the using of different combinations of moving and stationary components, such as, a stationary substrate 14, and a moving liquid module 10, or any other combinations or permutations thereof.

This invention also allows the use of components that perform any form or motion, including, but no limited to, vibration, rotation, translation, or oscillation of its components relative to each other or to an external frame of reference.

This invention can utilize components that perform any function other than those described in this specification, including, but no limited to, components that perform heating, scrubbing, bombardment with any type of particles, supercritical gas cleaning, ultrasonic cleaning or excitation, laser exposure or exposure to any form of radiation, to name a few.

This invention can be used, or having any number of its components, in an inverted fashion (i.e. upside down).

This invention can be used, or having any number of its components, at an angle from the horizontal.

This invention could allow the removal of fluid or fluids 23, which could be accomplished via other means or arrangements in addition to those described in this specification, such as, but not limited to, suction, gravity, chemical reaction, moving gas or fluid, displacement, surface-tension driven (e.g., Marangoni), mechanical, electromagnetic, to name a few.

This invention could be used with the delivery of fluid or fluids 23, which could be accomplished via different means or arrangements in addition to those described in this specification, such as, suction.

This invention can be used with or without the backside (non-process) surface confinement described herein.

The present invention may also employ, in accordance with various embodiments thereof, a fluid interaction element that is configured to interact with, e.g., move, displace, remove, spread, dry, etc., any liquid that is left on the second surface after the second surface passes over the fluid meniscus. Various examples of such a fluid interaction device, such as an air knife 100, a vacuum knife 120, blades 130, capillary material 140, such as depicted in FIGS. 7, 8, 9, and 10, respectively, are described herein. However, it should be understood that the present invention includes any device that is configured to interact with fluid that is left on the second surface after the second surface passes over the fluid meniscus.

Figure 7:
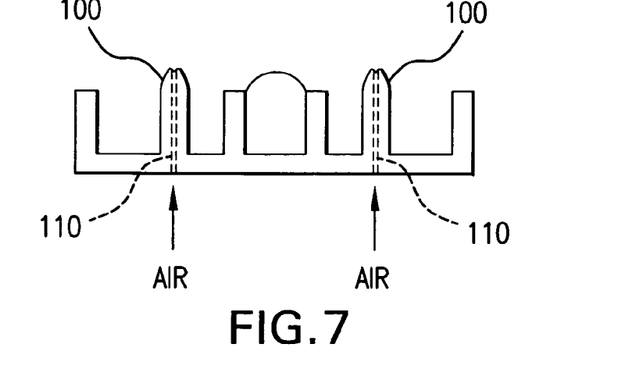
FIG. 7 illustrates another embodiment of this invention wherein air knives remove, spread, or blow onto liquid remaining on the second surface after it passes over the liquid meniscus.
Figure 8:
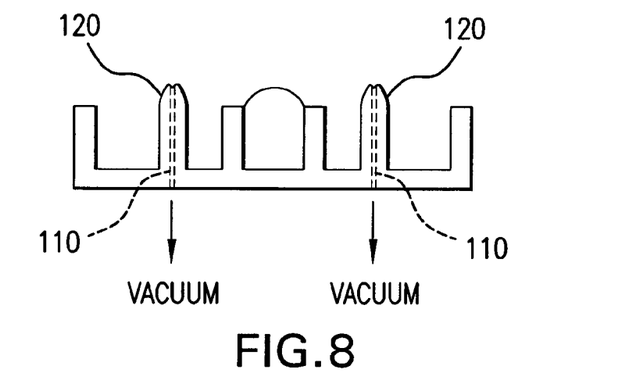
FIG. 8 illustrates still another embodiment of this invention wherein vacuum slits remove or reduce the amount of liquid remaining on the second surface after it passes over the liquid meniscus.
Figure 9:
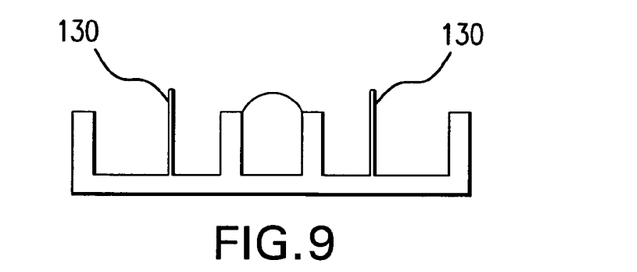
FIG. 9 illustrates yet another embodiment of this invention whereas a blade (e.g., squeegee) squeezes, removes, spreads, or reduces the amount of liquid remaining on the second surface after it passes over the liquid meniscus.
Figure 10:
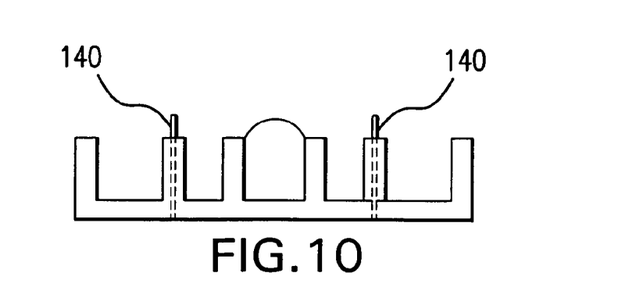
FIG. 10 illustrates still another embodiment of this invention wherein a capillary blade "mops up," removes, spreads, or reduces the amount of liquid remaining on the second surface after it passes over the liquid meniscus.

For example, as illustrated in FIG. 7, an air knife 100 may be configured to blow onto the second surface after it has passed over the fluid meniscus to act upon the remaining liquid. Air may be ducted into the air knives via appropriate conduits 110. Similarly, and as illustrated in FIG. 8 vacuum knife 120 can suction any or all of the liquid remaining on said second surface after passing over the fluid meniscus. A vacuum may be fed into the vacuum knives via appropriate conduits 110. Still further, and as illustrated in FIG. 9, an arrangement of blades 130 (flexible or not and made of a variety of materials, such as plastics, metals, ceramics, and other organic and inorganic compositions, depending on the application for which the system is being suited for) may allow the partial or total removal, or the spread of fluid or fluids left on the second surface after passing over the fluid meniscus. As illustrated in FIG. 10, these blades can also be made of a capillary material 140, among many other conceivable possibilities.

Figure 11A:
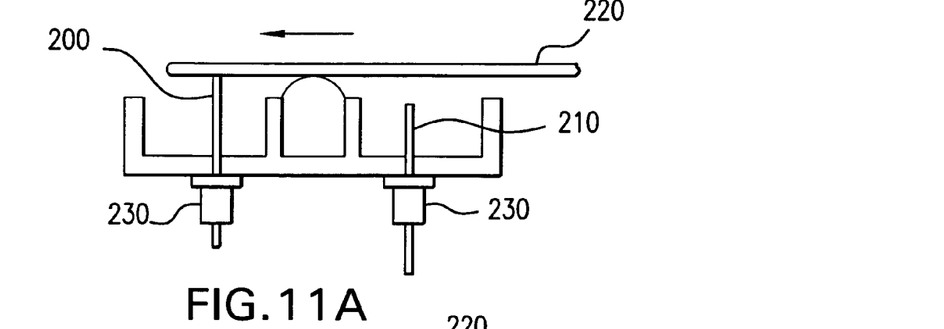
FIGS. 11a and 11b illustrate still another embodiment of this invention where any one or more of an air knife, vacuum slit, blade, capillary blade or the like moves towards or away from a plane defined by the substrate e.g., depending on the direction of the motion of the substrate or any other process conditions.
Figure 11B:
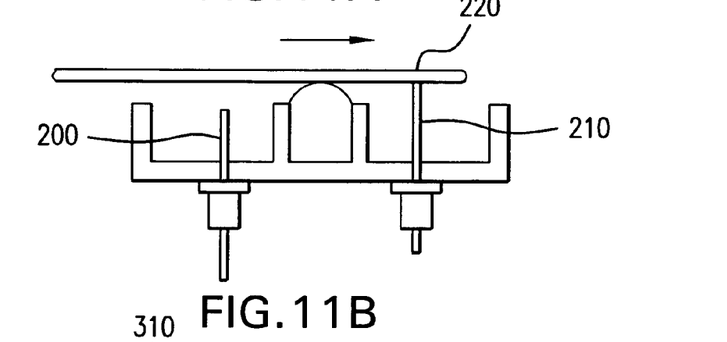

FIGS. 11a and 11b illustrate another alternative embodiment of this invention wherein the fluid interaction element, e.g., one or more of an air knife, vacuum knife, blade, or the like, may be configured to move relative to the substrate. For example, in one embodiment, the fluid interaction element is configured to move in a direction that is in non-parallel correspondence w/ the plane defined by the substrate, e.g., it may move up and/or down, or in and/or out of the path of the substrate. Furthermore, in one embodiment, the same may move in a manner that corresponds with the motion, e.g., direction and/or speed, of the substrate. Said knives, blades, or nozzles may be actuated by an electromagnetic, pneumatic, or any other kind of suitable actuator 230 to effect said motions. Further, alternative forms of energy may or may not be input into said fluid interaction devices described herein.

Figure 12A:
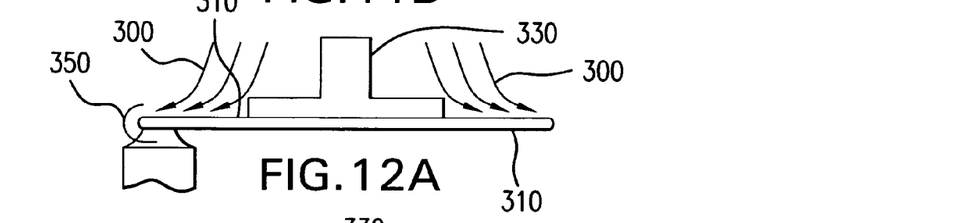
FIGS. 12a, 12b and 12c illustrate gas flowing onto the backside (first surface) of the substrate in order to assist in the confinement of the fluid, and any contamination resulting therein, to the front surface (second surface).
Figure 12B:
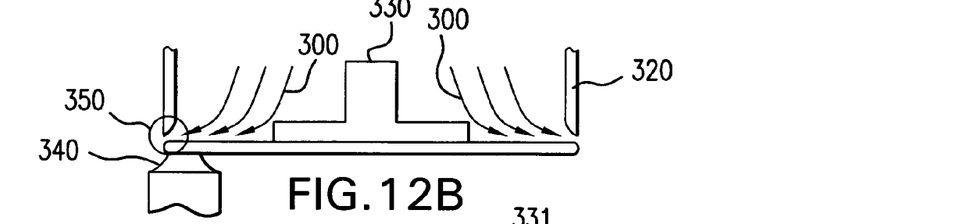
Figure 12C:
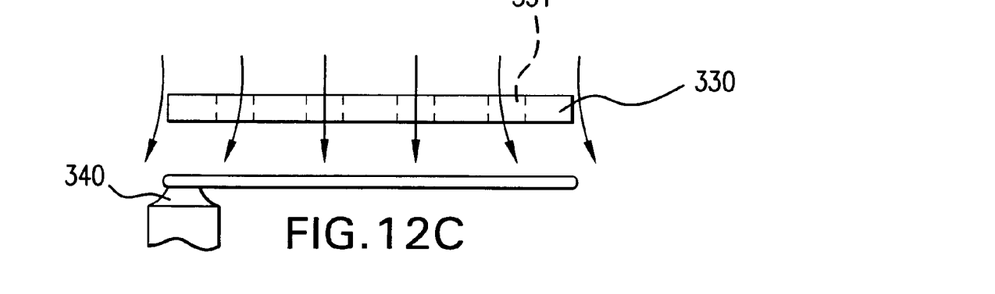

Furthermore, the present invention may include an embodiment in which a gas 300 is fed onto the back of the substrate 310 (first surface) in such a manner that at least part of said surface becomes in contact with said gas. FIGS. 12a and 12b depict one such example embodiment. One purpose of feeding said gas may be to form a gaseous stream that flows past the edge of the substrate 350 in such a manner as to prevent fluid 340, or any contamination that may enter said backside in the form of liquid, vapor or gas. The gas flow at the edge of the substrate may form a high pressure area "ring" around the edge of the substrate thus preventing said contamination. The gas flow described above may be implemented in conjunction with a variety of aerodynamic devices 320 that may direct, improve, deflect or otherwise affect the flow of the gas. The substrate may be held as described elsewhere in this application, e.g., by a chuck 330 or other such device, among many other conceivable arrangements, including contact or non-contact. Such a chuck may or may not contribute to the confinement and protection effect described above and may or may not work in conjunction with the gas flow arrangement. FIG. 12c illustrates yet another embodiment of the present invention, which illustrates a chuck 330 that includes passages 331 through which gas may travel. Fluid, e.g., gas, may circulate between the chuck and the substrate.

The present invention may also be used in conjunction with a fluid reservoir or meniscus that can take any number of different shapes. One particular embodiment is depicted in FIGS. 1 and 2 where a linear reservoir is shown in cross section. A linear reservoir consists of, e.g., a long, rectangular pool—as seen from the top—of fluid that can be of any length or width, and not necessarily encompass the whole width of the object. More general cases would consist of reservoirs of different shapes and sizes. Of particular note, reservoirs may be provided with a "pie" shape, a "D" shape, a round shape, or combinations, superpositions or distortions of said shapes. Depending on the shape of the area of the object meant to interact with the liquid, the reservoir can take any shape. Also, the motion of the object over the reservoir can consist of any combination of translation along a given direction, rotation, oscillation, or combinations or superpositions of these, in order to expose the surface of the object in any desired fashion. The motions may include, but are not limited to, a scanning motion at constant or variable speed or following a speed "profile" along its motion; rotation in place without translation, rotation at either or both ends of the translational motion, rotation in a given sequence of angular motions or angular speeds, including, but not limited to constant rotation, in combination with partial translational movements either in sequences, in a correlated or uncorrelated fashion. Translational motion can be in any of the three dimensions and any motion can be correlated or uncorrelated with any other aspect of the invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for performing a fluid meniscus process on an object, the object having a first surface and a second surface, comprising:
    (a) at least one holding tank containing a fluid forming a fluid meniscus;
    (b) a holding fixture for holding the object such that at least a portion of the fluid meniscus contacts and is transferred to at least a portion of the second surface of the object, the holding fixture configured to generate two or more uniform stripes on the second surface by moving the object and the at least one holding tank relative to each other in a single-sided process while the meniscus of the at least one holding tank contacts the object; and
    (c) a fluid interaction element including at least one of an air knife, a blade, and a capillary material, the at least one of an air knife, a blade, and a capillary material being configured to interact, during the movement of the object and the at least one holding tank relative to each other, with the at least a portion of the fluid meniscus that was transferred to the second surface.

2. The apparatus of claim 1, wherein the fluid interaction element is configured to at least one of move, displace, remove, spread and dry the at least a portion of the fluid meniscus that was transferred to the second surface.

3. The apparatus of claim 1, wherein the fluid interaction element is moveable relative to the object.

4. The apparatus of claim 3, wherein the fluid interaction element is configured to move into and/or out of a path defined by the movement of the object.

5. The apparatus of claim 3, wherein a movement of the fluid interaction element corresponds to a motion of the object.

6. The apparatus of claim 5, wherein the movement of the fluid interaction element corresponds to at least one of a speed and a direction of motion of the object.

7. The apparatus of claim 3, wherein the movement of the fluid interaction element is actuated by an actuator, the actuator being at least one of pneumatic and electromagnetic.

8. The apparatus of claim 3, wherein at least one of the fluid interaction element and the object are configured to move relative to each other, the relative motion including at least one of translation, rotation, oscillation, and/or portions, combinations, or superpositions of said motions.

9. The apparatus of claim 1, wherein the fluid interaction element is configured to provide a gas on at least a portion of the first surface of the object so as to prevent the at least a portion of the fluid meniscus that was transferred to the second surface from moving to the first surface.

10. The apparatus of claim 9, wherein the gas is provided so as to prevent liquid, vapor and/or gas generated by the at least a portion of the fluid meniscus that was transferred to the second surface from moving to the first surface.

11. The apparatus of claim 9, wherein the holding fixture functions in combination with the fluid interaction element so as to prevent the at least a portion of the fluid meniscus that was transferred to the second surface from moving to the first surface.

12. The apparatus of claim 1, wherein the holding tank has a shape, and imparts a corresponding shape to the fluid meniscus, that includes one of a long rectangle, a "pie" shape, a "D" shape, a round shape, and combinations, superpositions or distortions of said shapes.

13. The apparatus of claim 1, wherein the apparatus is configured to remove the at least a portion of the fluid meniscus from contact with the second surface of the object after at least one such contact.

14. The apparatus of claim 1, wherein the object is selected from a group consisting of semiconductor wafer, substrate, metal and non-metal composites, metal and non-metallic material, silicon, indium phosphide, ceramic, glass, group IV element, group III-V compound, group II-VI compound, and binaries and ternaries thereof.

15. The apparatus of claim 1, wherein the object is held by the holding fixture using at least one of mechanical, vacuum, electrostatic, fluidic, magnetic and electromagnetic operation.

16. The apparatus of claim 1, wherein the fluid is selected from a group consisting of an etching fluid, a plating fluid, a solvent, a photo resist, a developer and a stripper.

17. The apparatus of claim 1, wherein the fluid in the holding tank is at least one of re-circulated, agitated, heated and replenished.

18. The apparatus of claim 1, wherein the object has at least one coating of at least one material, and wherein the coating is selected from a group consisting of metal, organic material, inorganic material, insulator and resist.

19. The apparatus of claim 1, wherein the holding tank has at least one channel to hold the fluid.

20. The apparatus of claim 1, wherein the holding tank has at least one overflow channel.

21. The apparatus of claim 1, wherein the fluid is injected onto the holding tank using at least one pump.

22. The apparatus of claim 1, wherein the fluid etches the at least a portion of the second surface of the object, and wherein the object is selected from a group consisting of semiconductor wafer, substrate, metal and non-metal composites, metal and non-metallic material, silicon, indium phosphide, ceramic, glass, group IV element, group III-V compound, group II-VI compound, and binaries and ternaries thereof.

23. The apparatus of claim 1, wherein the fluid meniscus is used to perform a function selected from a group consisting of etching, thinning, electroplating, micro-structure release, cleaning, electronic device fabrication, electrochemical processing, photochemical processing, photo-electro plating, optoelectronic processing, patterning, resist application, developing, plating, coating and stripping.

24. An apparatus for performing a fluid meniscus process on an object, the object having a first surface and a second surface, comprising:
 (a) at least one holding tank containing a fluid forming a fluid meniscus;
 (b) a holding fixture configured to hold the object such that at least a portion of the fluid meniscus contacts and is transferred to at least a portion of the second surface of the object, the holding fixture being configured to generate two or more uniform stripes on the second surface by moving the object and the at least one holding tank relative to each other in a single-sided process while the meniscus of the at least one holding tank contacts the object; and
 (c) a fluid interaction element configured to interact, during the movement of the object and the at least one holding tank relative to each other, with the at least a portion of the fluid meniscus that was transferred to the second surface, at least a portion of the fluid interaction element being configured to move transversely with respect to the relative movement between the object and the at least one holding tank.

25. An apparatus for performing a fluid meniscus process on an object, the object having a first surface and a second surface, comprising:
 (a) at least one holding tank containing a fluid forming a fluid meniscus; and
 (b) a holding fixture configured to hold the object such that at least a portion of the fluid meniscus contacts and is transferred to at least a portion of the second surface of the object,
 wherein the apparatus is configured to generate two or more uniform stripes on the second surface by moving the object and the at least one holding tank relative to each other in a single-sided process while the meniscus of the at least one holding tank contacts the object.

26. The apparatus of claim 25, wherein the apparatus is configured to generate the two or more uniform stripes by moving the object in two or more consecutive lateral directions with respect to the at least one holding tank during the single-sided process such that each of the consecutive lateral movements creates a respective one of the consecutive uniform stripes along the second surface.

27. The apparatus of claim 25, wherein the apparatus is configured to generate the two or more uniform stripes by causing contact between two or more respective fluid menisci during the single sided process.

* * * * *